(12) United States Patent
Zimmerman et al.

(10) Patent No.: US 6,687,170 B2
(45) Date of Patent: Feb. 3, 2004

(54) SYSTEM AND METHOD FOR STORING PARITY INFORMATION IN FUSES

(75) Inventors: Ulrich Zimmerman, Mechanicsville, VA (US); Robert Petter, Wandlitz (DE)

(73) Assignee: Infineon Technologies Richmond, LP, Sandston, VA (US)

( * ) Notice: Subject to any disclaimer, the term of this patent is extended or adjusted under 35 U.S.C. 154(b) by 145 days.

(21) Appl. No.: 10/010,977

(22) Filed: Dec. 6, 2001

(65) Prior Publication Data

US 2003/0110349 A1 Jun. 12, 2003

(51) Int. Cl.⁷ .................................................. G11C 7/00
(52) U.S. Cl. ..................................... 365/200; 365/225.7
(58) Field of Search .............................. 365/200, 225.7, 365/96, 230.03, 201

(56) References Cited

U.S. PATENT DOCUMENTS

| | | | |
|---|---|---|---|
| 5,835,431 A | | 11/1998 | Miner et al. |
| 5,859,801 A | * | 1/1999 | Poechmueller ............... 365/200 |
| 5,883,903 A | | 3/1999 | Higashitani |
| 5,999,463 A | * | 12/1999 | Park et al. ................... 365/200 |
| 6,430,101 B1 | * | 8/2002 | Toda ........................ 365/225.7 |

* cited by examiner

*Primary Examiner*—Richard Elms
*Assistant Examiner*—Anh Phung
(74) *Attorney, Agent, or Firm*—Lerner, David, Littenberg, Krumholz & Mentlik, LLP

(57) ABSTRACT

A system and method for determining the accuracy of the states of fuses by changing, or not changing, the state of additional fuses. The system includes a memory including addressable storage elements, address fuses whereby each fuse includes a link in a connected or disconnected state and the collective state of the address fuses identifies an address value, a parity fuse whereby the fuse includes a link in a connected or disconnected state and the state of the parity fuse represents a parity value, the parity value being based on, but not equivalent to, the address of an addressable storage element, and; an output providing a value dependant upon the address value and the parity value.

26 Claims, 4 Drawing Sheets

SYSTEM AND METHOD FOR STORING PARITY INFORMATION IN FUSES

BACKGROUND OF THE INVENTION

In a memory circuit, such as a dynamic random access memory (DRAM) or a field programmable logic device, a plurality of memory cells are typically arranged in rows and columns for addressable access. For example, a DRAM chip may include 256 million or more cells, which are arranged in an array of rows (activated by word lines) or columns (activated by bit lines).

In a conventional DRAM chip, one or more of the millions of cells of the memory array may be defective. In order to avoid the need to discard an entire DRAM chip, redundant cells are provided that may be substituted for the one or more defective cells. Usually, if a particular cell in the memory array is determined to be defective, the entire row and column containing the defective cell is usually replaced by a redundant row and column. Herein, rows and columns of cells may be referred to as storage elements.

A conventional technique of substituting a defective storage element of the memory array with a replacement storage element involves using address fuses. Typically, each replacement storage element is associated with a bank of fuses. The address of a defective storage element is stored in the fuse bank so that calls to that address will activate the redundant storage element associated with the fuse bank.

Addresses are typically stored in the fuse bank by severing or maintaining the state of the individual fuses. Each fuse within an address fuse bank includes a fusible link which is capable of being severed (also "blown") by the use of a laser or electrically by a high current. A value, such as a logical one (1) or zero (0), may be attributed to the fuse depending on whether the link remains connected or disconnected. In use, when a defective storage element of the memory array is addressed, a comparison of the incoming address and the address stored in the address fuses will match (there may be other fuses as well such as an enabling fuse) This indicates that the replacement storage element should be accessed instead of the defective storage element of the memory array.

Typical manufacturing processes perform a number of tests and operations to bypass defective storage elements with redundant storage elements. First, the chip is tested for defective storage elements. Second, for each storage element found to be defective, a redundant storage element is chosen. Third, a laser station blows some, none or all of the fuses of the redundant storage element's fuse bank to identify the address of the defective storage element.

Commercially-available laser stations tend not to be completely accurate. Occasionally, the laser will fail to sever a fusible link which should have been severed, may only partially sever a link which should have been severed, or may sever a link which should not have been severed. Similar problems tend to occur—and can occur more often—when blowing fuses electrically. Accordingly, some manufacturing processes recheck the chip by testing it again for defective storage elements. However, it substantially increases costs and processing times to do a full post-fuse test on every chip. Although processes exist which can physically scan the dies for failed fuses, these processes tend to be particularly difficult for DRAMS because DRAMS usually contain several fuse areas for different subunits of the die.

In view of the foregoing, there is a need in the art for a new system and method in which it is possible to quickly determine whether the fuses within a fuse bank accurately represent the information they are supposed to store.

SUMMARY OF THE INVENTION

The present invention addresses this need among others.

One aspect of the invention provides a system for determining the accuracy of address fuses. The system includes a memory including addressable storage elements; address fuses whereby each fuse includes a link in a connected or disconnected state and the collective state of the address fuses identifies an address value; a parity fuse whereby the fuse includes a link in a connected or disconnected state and the state of the parity fuse represents a parity value, the parity value being based on, but not equivalent to, the address of an addressable storage element, and; an output providing a value dependant upon the address value and the parity value.

Another aspect of the invention is a memory having: a memory including addressable storage elements; a fuse bank whereby the state of a first set of the fuses defines a first value and the state of a second set of fuses defines a second value based on the address of a defective storage element; and digital logic circuits structured and arranged to generate a signal indicative of whether the value defined by the first set of fuses is different from the address of the defective storage element, the signal being based on the state of the first and second set of fuses.

Yet a further aspect of the invention involves a method of manufacturing a die. It includes providing the address of a storage element in memory; providing a test value dependant on the address; determining which, if any, address fuses on the die should be blown based on the address; determining which, if any, other fuses on the die should be blown based on the test value; blowing fuses based on such determinations; and determining the accuracy of the step of blowing fuses including comparing the state of the address fuses with the state of the other fuses.

A still further aspect of the invention provides a system for determining whether information actually stored on a device matches information that was to be stored on the device. The system includes a plurality of fuses, each fuse having a connected state and a disconnected state; a first set of the fuses being such that the state of the fuses in the first set represents the information actually stored on the device; a second set of fuses being such that the state of the fuses in the second set represents information which is a function of the information that was to be stored on the device; and means for comparing the information represented by the first set of fuses against the information represented by the second set of fuses.

The means for comparing the values representative of the fuse states is not limited to any particular structure or arrangement. By way of example only, it may be comprised of an interconnected collection of digital logic elements, an analog circuit, or a processor which manipulates and transfers data in accordance with a program.

The methods and systems are similarly not limited in the type of information which may be used to confirm the accuracy of the information stored in the fuses. For example, if one set of fuses represents information, the other set of fuses may represent a value indicative of the information's parity. This may include even parity, odd parity, a Hamming code or some other testing function.

Other aspects, features, advantages, etc., will be apparent to one skilled in the art when the disclosure herein is taken in conjunction with the accompanying drawings.

BRIEF DESCRIPTION OF THE DRAWINGS

For the purposes of illustrating the invention, there are shown in the drawings, various embodiments, it being understood, however, that the invention is not limited to the precise arrangements and instrumentalities shown.

DETAILED DESCRIPTION

Figure 1:
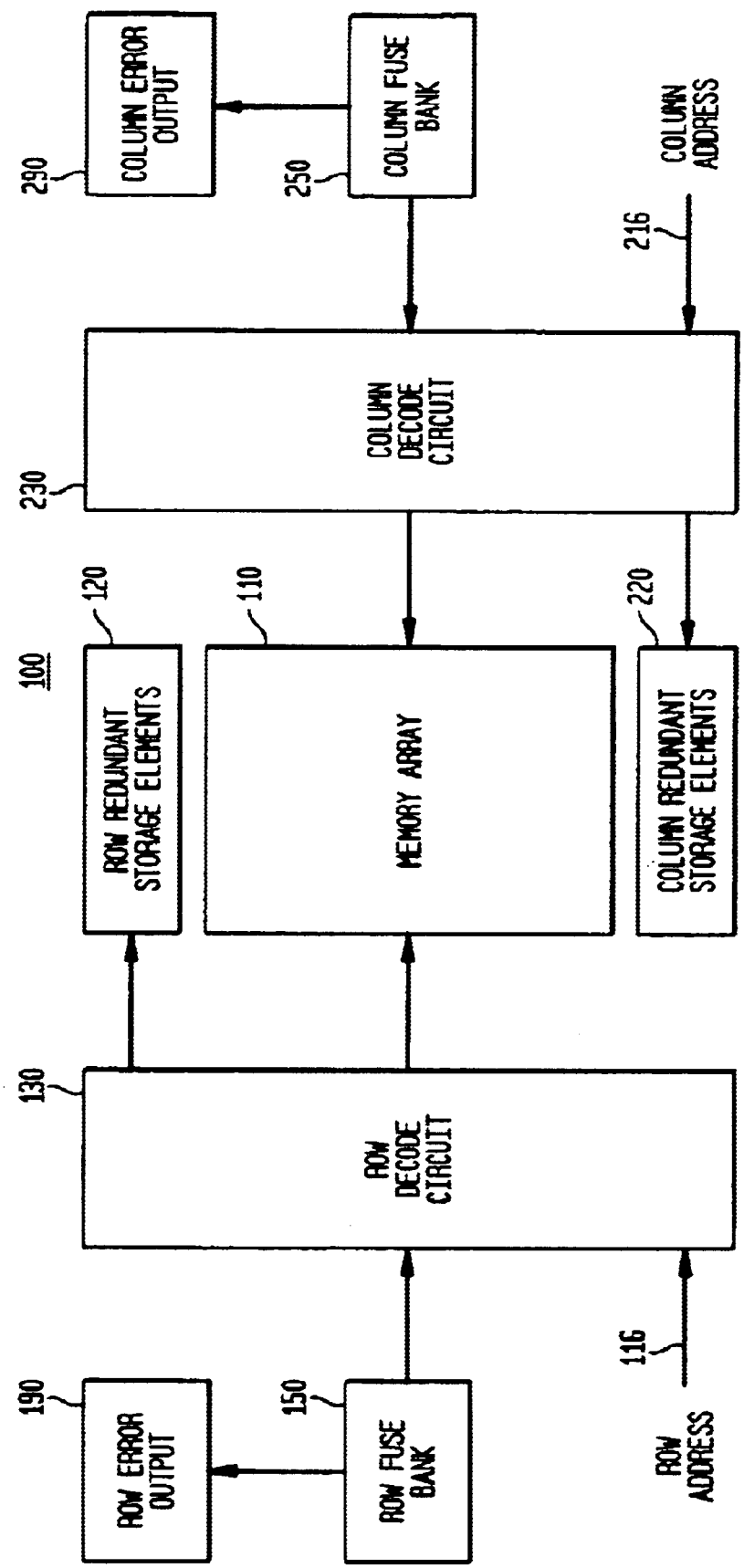
FIG. 1 is a block diagram of a system in accordance with an embodiment of the invention.

A system 100 in accordance with one embodiment of the invention is shown in FIG. 1. System 100 includes a memory 110, row decode circuit 130, row redundant storage elements 120, row fuse bank 150, row error output 190, row address 116, column decode circuit 230, column redundant storage elements 220, column fuse bank 250 and column error output 290.

Memory 110 comprises an array of storage elements in rows and columns. Access to the memory is gained by providing a row address 116 and a column address 216 corresponding with the desired storage element. Row decode circuit 130 and column decode circuit 230 activate the rows and columns, respectively, of memory 110. Decode circuits 130 and 230 accept row address value 116 and column address value 216, respectively, as input.

In the event a row or column of memory array 110 is defective, the decode circuits will not activate the applicable row or column in memory 110. Rather, the decode circuits will activate a redundant row or column in row redundant storage elements 120 or column redundant storage elements 220, respectively.

Row and column decode circuits 130 and 230 determine whether a redundant row or column needs to be activated by checking row fuse bank 150 and column fuse bank 250, respectively. These fuse banks store the addresses of the rows and columns to be replaced.

Figure 2:
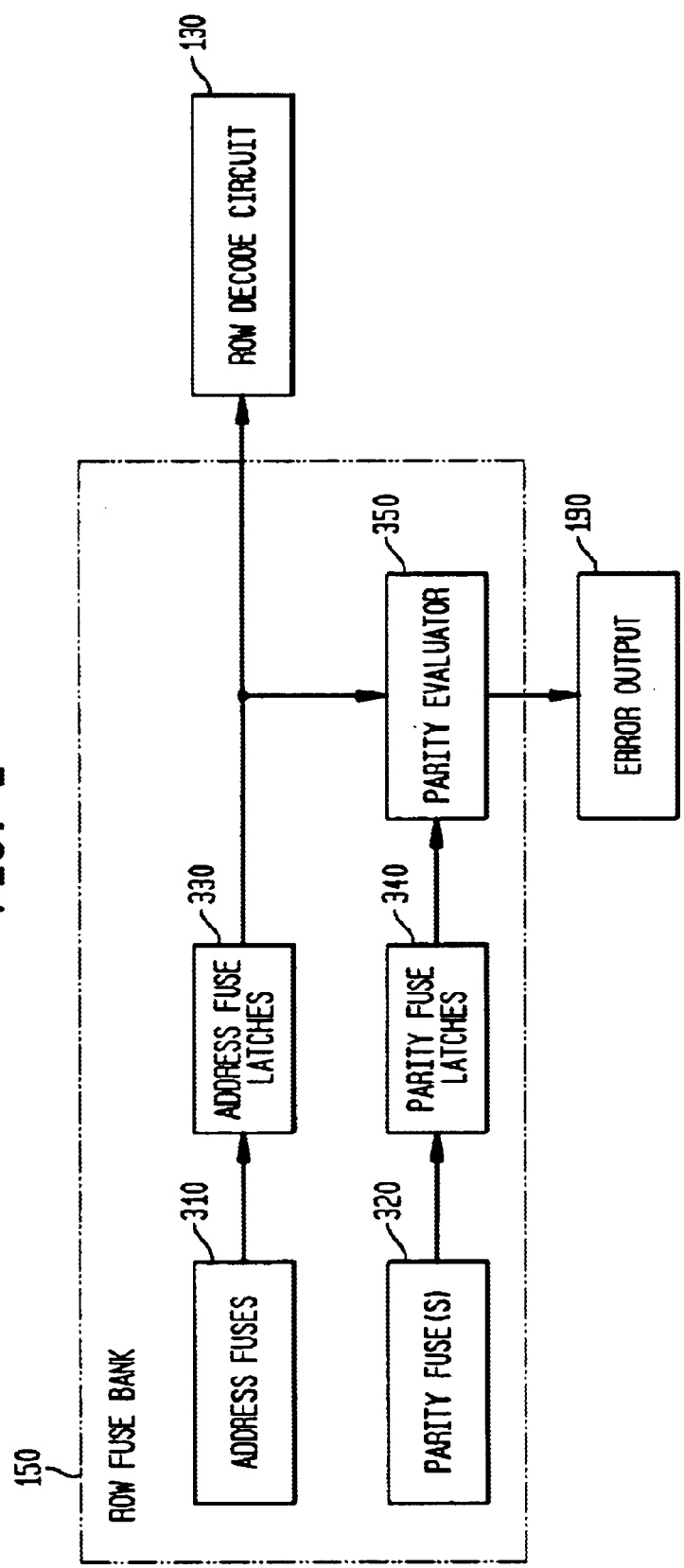
FIG. 2 is a block diagram of a system in accordance with an embodiment of the invention.

FIG. 2 illustrates a schematic view of the row fuse bank in accordance with one embodiment of the invention. (Although portions of the remaining disclosure are directed to the row decode circuit 130, row fuse bank 150, row error output 190 and row redundant storage element 120, it will be understood that the structure and operations of column decode circuit 230, column fuse bank 250, column error output 290 and column redundant storage elements are similar). As is known to those of ordinary skill in the art, address fuse bank 150 includes a bank of address fuses 310 whose state, such as fused or not fused, collectively identifies the address of a row in memory 110.

Row fuse bank 150 also includes one or more parity fuses 320. As explained below, the state of the parity fuse(s) 320 is used to determine whether the state of address fuses 310 accurately represents the information intended to be stored.

Address fuse latches 330 and parity fuse latches 340 are in communication with address fuses 310 and parity fuse(s) 320, respectively. The fuse latches output a value that reflects the state of the associated fuse. For example, if a fuse link is disconnected, the value of its associated latch may be "1" whereas if the fuse link is connected, then the value of its latch may be "0". The latches are also connected to, and output their values to, decode circuit 130 and parity evaluator 350.

Parity evaluator 350 includes circuitry to provide an output value which is based on the state of the address fuses and parity fuses. The circuitry may comprise a processor and a set of instructions which calculates an output value dependant upon the state of the address fuses and parity. It may also comprise analog circuits. However, it is particularly advantageous if parity evaluator 350 comprises a logic circuit which accepts latch values as inputs.

Figure 3:
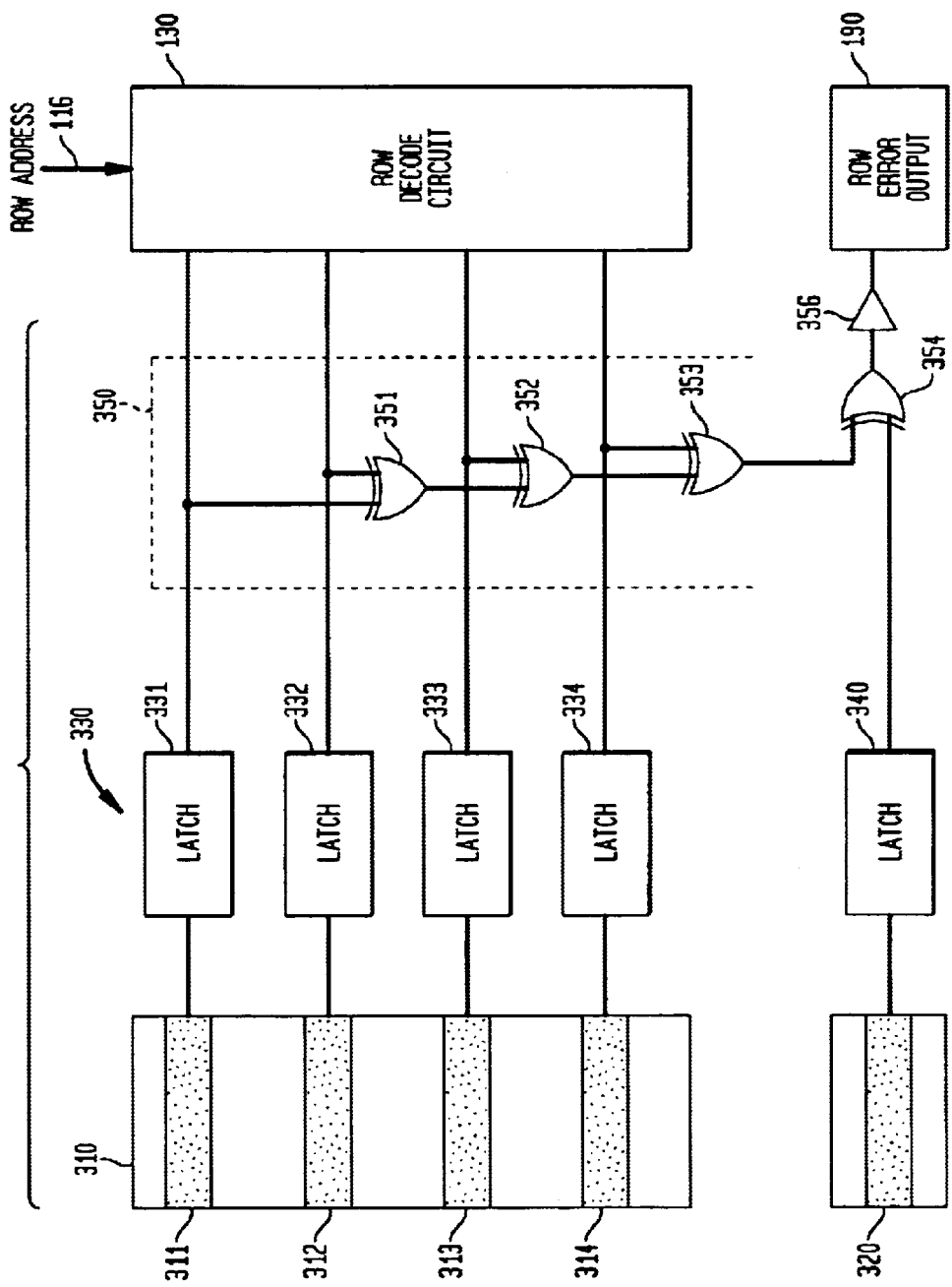
FIG. 3 is a schematic diagram of a system in accordance with an embodiment of the invention.

FIG. 3 illustrates a schematic diagram of row fuse bank 150 in accordance with an embodiment of the invention. Although those of ordinary skill in the art will appreciate that many types of fuses may be used, address fuses 311–314 and parity fuse 320 shall be considered to comprise a strip of conductive material between two contacts. For the purposes of discussion only, address fuses 311–314 shall further be considered to be capable of, and intended to, store a 4-bit address of a defective row within memory 110 (it being appreciated that such an address is likely to be greater than 4 bits and that the fuse bank may identify other addresses or information other than addresses). A laser may be used to sever these strips and change the state of the fuse. The fuses are connected to circuitry for providing a signal indicative of whether the associated fuse is connected or disconnected, such as latches 331–334. Parity fuse 320 is similarly connected to latch 340.

The outputs of latches 331–34 and 340, in turn, are connected to parity evaluator 350. In one embodiment as shown in FIG. 3, parity evaluator 350 includes a collection of digital logic elements forming an even parity check. For example, each latch 331–334 outputs a signal to XOR gate 351–353 and the ultimate result is applied to XOR gate 354. Latch 340 from parity fuse 320 also outputs a signal to XOR gate 354 which is then output to inverter 356. The output of the entire gate configuration is, in turn, provided to row error output 190. The outputs of the latches are also passed to the row decode circuit 130. Instead of an even parity check, an odd parity may also be used.

Row error output 190 provides a value indicative of whether the state of the address fuses accurately reflects the desired information. The value may be queried by equipment external to the chip itself via the output. If desired, the value may also be used by the chip itself. For the purposes of reference only, a value of "1" would be indicative of an error and a value of "0" would be indicative of no error. These designations are arbitrary and are used for the purpose of illustration only; other values can also be used.

The operation of the invention in accordance with an embodiment will now be described. In a manner known to those of ordinary skill in the art, memory array 110 is tested to determine whether any of its rows or columns are defective. If it is, then decode circuits 130 or 230, as the case may be, will be instructed to divert address requests from the defective row or column to a redundant row or column in the redundant storage elements 120 or 220. The decode circuits are instructed to perform this operation by using a laser station to blow the fuses accessed by the decode circuits.

Figure 4:
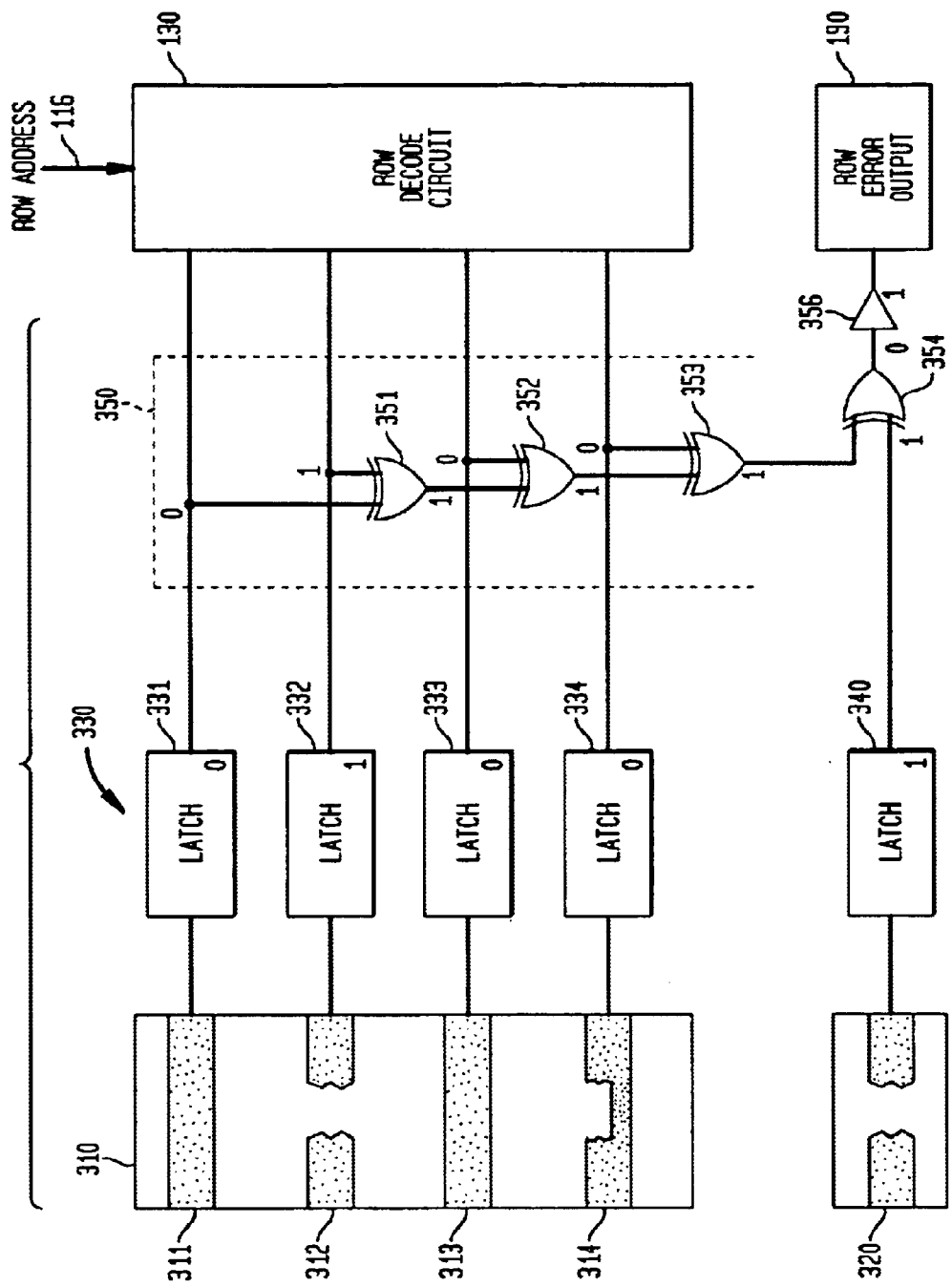
FIG. 4 is a schematic diagram of the system of FIG. 3, including exemplary values after certain fuses have been disconnected.

By way of illustration only and using the exemplary circuit of FIG. 4, if the row at address "0101", of memory 110 is defective, then a laser is used to sever fuses 312 and 314 which will cause associated latches 332 and 334 to output a value of "1". The other latches 331 and 313 will output a value of "0" because they are associated with fuses which remain connected.

When row decode circuit 130 receives row address 116, row decode circuit 130 will query the latches to determine whether that address corresponds with a defective row. If it does, then row decode circuit 130 will activate a row in row redundant storage elements 120 instead of the requested defective row in memory 110. Accordingly, if the value of row address 116 is "0101" and fuses 312 and 314 are severed, then the row decode circuit would activate a redundant row rather than the row at address "0101" in memory 110.

However, the laser may not have correctly blown all of the required fuses. For example, as shown in FIG. 4, fuse 314 may have been only partially severed. Because the fuse remains connected, latch 334 will output a value indicating that the fuse remains connected even though it was supposed to be disconnected. Accordingly, because fuses 310 would identify address "0100" rather than address "0101", row decode circuit may activate row "0101" in memory 110 even though it is defective.

The present invention addresses this problem by causing the laser station to change or maintain the state of one or more additional fuses to test the accuracy of the address fuses. As shown in FIG. 4, the laser will blow parity fuse 320 if the laser attempted to blow an even number of address fuses. The laser will leave the parity fuse in its connected state if the laser was supposed to blow an odd number of address fuses.

The accuracy of the laser step is tested by querying the error output 190. Using the exemplary values shown in FIG. 4, the value outputted from the collection of XOR gates 351–353 will be "1", indicating that there is an odd number of connected fuses (as a result of the partially connected fuse 314). This value is compared at gate 354 with the state of the parity fuse 320. Because parity fuse 320 is blown, this causes latch 340 to output a value of "1", indicating that an even number of fuses should have been blown. As a result, XOR gate 354 will output a value of "0" which is then inverted to "1" at inverter 356. The result is then outputted at row error output 190. Accordingly, if the expected state of the fuses matched the actual state of the fuses, then the row error output 190 would receive a value of "0" and, thus, indicate that there is no error. However, because the expected state of the fuses does not match the actual state of the fuses because of partially severed fuse 314, row error output 190 receives a value of "1" indicating the presence of an error.

Accordingly, the present invention has the advantage of allowing a chip to indicate whether a fuse bank has been correctly blown by comparing the current state of the fuses with the expected state of the fuses. If an error signal is present, the chip could be tested further to determine which fuse was incorrectly severed (or left connected). Once identified, the chip might be sent back to a laser station to correct the defect or, more typically, discarded.

The invention provides even greater advantages when used with more sophisticated parity checking. For example, rather than using a single fuse 320 to indicate whether an even or odd number of fuses should have been disconnected, a plurality of fuses may be used to provide more information about the desired state of the address fuses.

In one embodiment of the invention, parity fuses 320 comprise a plurality of fuses whose states collectively represent the Hamming code of the desired state of the address fuses 311–314. A Hamming code can not only indicate whether there was an error, but potentially where the error occurred. For example, if address fuses 310 identified a 7 bit address and thus comprised 7 fuses, the use of 3 parity fuses 320 in a Hamming code configuration could potentially allow the identification of the precise fuse which was improperly left connected or disconnected.

In operation, a computer would derive the Hamming code for the intended address to be stored in the address fuses 310. During the laser operation, the Hamming code would be stored on the chip by blowing the appropriate parity fuses 320. Parity evaluator 350 would include a collection of logic gates sufficient to compare the Hamming code against the actual state of the address fuses 310 and output the result at error output 360. Alternatively, the evaluator would compare the address values with the parity values by using a processor in accordance with a program. Regardless, the output could be queried after the testing process and, if there is an error, the defective fuse may be immediately identified based on the Hamming code and without further testing. The use of Hamming codes thus provides even greater advantages because it not only detects errors, but also identifies the incorrect fuse without further testing.

One of the advantages of the invention is its ability to flexibly accommodate different types of parity checking. For example, processes other than Hamming codes may be used to locate the identify of fuses having incorrect values.

Another advantage of the invention is its scalability. The invention can be used regardless of the number of fuses. Moreover, because the number of payload fuses will far outnumber the number of parity fuses, most typical chip layouts will have enough die space to accommodate the additional fuses. Indeed, in a group of 502 fuses, only 9 additional parity fuses are required when using a Hamming code to identify one failing fuse.

Yet another advantage of the invention is that it is stored on the chip itself. It is not necessary to invest in expensive scanning or fuse testing equipment in order to check for failed fuses. Rather, testing for failed fuses is as simple as querying the error outputs 190 and 290 for an error value.

In yet another aspect of the invention, the chip corrects its own errors. In this embodiment, the chip uses the parity code to determine which (if any) of the electrical fuses are only partially blown. When the fuse is identified, the chip passes a high current through the fuse, thus blowing it completely. In this manner, the chip can correct its own errors. This aspect of the invention may be particularly advantageous for addressing single fuse degradation.

A further advantage of the invention is that the state of the fuses can be tested long after the manufacturing process. Some fuses may degrade during the lifetime of the product. The invention provides a relatively simple way of testing for fuse degradation and, potentially, letting the chip correct itself.

The invention also has the advantage of being applicable to the next generation of DRAMs. Electrical fuses can be subject to lower fuse success rates and reliability. The present invention provides a fast, low-cost manner of mitigating that issue.

Unless stated to the contrary, use of words such as "including," "containing," "comprising" and the like, means "including without limitation" and shall not be construed to limit any general statement that it follows to the specific or similar items or matters immediately following it. References to a "plurality" of things means at least two of the things, and, unless stated to the contrary, reference to "a" or "one" thing does exclude the possibility of using a plurality of such things.

Most of the foregoing alternative embodiments are not mutually exclusive, but may be implemented in various combinations to achieve unique advantages. As these and other variations and combinations of the features discussed above can be utilized without departing from the invention as defined by the claims, the foregoing description of the embodiments should be taken by the way of illustration rather than by way of limitation of the invention as defined by the claims.

What is claimed is:

1. A system for determining the accuracy of address fuses comprising:
   a memory including addressable storage elements,
   address fuses whereby each fuse includes a link in a connected or disconnected state and the states of the address fuses collectively identify an address value,
   a parity fuse whereby the fuse includes a link in a connected or disconnected state and the state of the parity fuse represents a parity value, the parity value being based on, but not equivalent to, the address of an addressable storage element, and
   an output providing a value dependant upon the address value and the parity value.

2. The system of claim 1 wherein the parity value represents the even or odd parity of the address of the addressable storage element.

3. The system of claim 1 further including a plurality of parity fuses whereby the states of the parity fuses collectively represent the parity value.

4. The system of claim 3 wherein if the address value differs from the address of an addressable storage element, then the fuses associated with such difference may be determined from the parity value.

5. The system of claim 4 wherein the parity value is based on a Hamming code of the address of the addressable storage element.

6. The system of claim 3 wherein the number of parity fuses used to represent the parity value is less than the number of address fuses used to represent the address value.

7. The system of claim 1 further comprising comparison means for comparing the address value and the parity value, and providing the results of the comparison to the output.

8. The system of claim 7 wherein the comparison means comprises digital logic elements.

9. The system of claim 8 wherein the comparison means does not include a processor.

10. The system of claim 7 wherein the comparison means includes a processor.

11. The system of claim 7 wherein the memory, address fuses, parity fuse, output and comparison means are on the same die.

12. The system of claim 1 further including latches in communication with the fuses such that output of the latch represents the state of the fuse.

13. A memory comprising:
   a memory including addressable storage elements,
   a fuse bank whereby the state of a first set of the fuses defines a first value and the state of a second set of fuses defines a second value based on the address of a storage element,
   a circuit structured and arranged to generate a signal indicative of whether the first value is different from the address of the storage element, the signal being based on the state of the first and second set of fuses.

14. The memory of claim 13 further including redundant storage elements and a decode circuit, the decode circuit accepting an address as input and activating a storage element in the memory at that address or a storage element in the redundant storage element depending upon whether the first value matches the inputted address.

15. The memory of claim 13 wherein the second value is not equivalent to the address of the storage element.

16. The memory of claim 13 wherein the second value represents the even or odd parity of the address of the storage element.

17. The memory of claim 13 wherein the state of a fuse of the first set is responsible for the difference between the first value and the address of the storage element, and whereby the signal is sufficient to identify said fuse.

18. The memory of claim 13 wherein the second value represents the Hamming code of the storage element.

19. A system for determining whether information actually stored on a device matches information that was to be stored on the device comprising:
   a plurality of fuses, each fuse having a state dependent upon the connection of a link of the fuse,
   a first set of said fuses such that the state of the fuses in the first set represents the information actually stored on the device,
   a second set of said fuses such that the state of the fuses in the second set represents information which is a function of the information that was to be stored on the device, and
   means for comparing the information represented by the first set of fuses against the information represented by the second set of fuses.

20. The system of claim 19 wherein the state of the fuse is connected or disconnected.

21. The system of claim 19 wherein the function determines a parity value for the information that was to be stored on the device.

22. The system of claim 21 wherein the means for comparing includes one or more logic elements for comparing the parity value with the information represented by the first set of fuses.

23. The system of claim 22 wherein the means for comparing does not include a processor.

24. The system of claim 22 wherein the means for comparing includes a processor for comparing the parity value with the information represented by the first set of fuses.

25. The system of claim 21 wherein the parity value represents the even or odd parity of the information that was to be stored on the device.

26. The system of claim 21 wherein the parity value represents the Hamming code of the information that was to be stored on the device.

* * * * *